United States Patent
Jang et al.

(10) Patent No.: US 12,363,839 B2
(45) Date of Patent: Jul. 15, 2025

(54) DISPLAY DEVICE

(71) Applicant: SAMSUNG DISPLAY CO., LTD., Yongin-si (KR)

(72) Inventors: Jae-Soo Jang, Suwon-si (KR); Juyeop Seong, Suwon-si (KR); Hee-Kwon Lee, Asan-si (KR); Sungu Kim, Seoul (KR); Yeongheon Kim, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 241 days.

(21) Appl. No.: 17/986,996

(22) Filed: Nov. 15, 2022

(65) Prior Publication Data

US 2023/0284404 A1 Sep. 7, 2023

(30) Foreign Application Priority Data

Mar. 3, 2022 (KR) ........................ 10-2022-0027665

(51) Int. Cl.
| | |
|---|---|
| *H05K 5/00* | (2025.01) |
| *B32B 3/14* | (2006.01) |
| *B32B 3/26* | (2006.01) |
| *B32B 7/12* | (2006.01) |
| *H05K 5/02* | (2006.01) |
| *B32B 15/08* | (2006.01) |
| *B32B 15/18* | (2006.01) |
| *B32B 15/20* | (2006.01) |
| *B32B 17/06* | (2006.01) |
| *B32B 27/06* | (2006.01) |
| *H10K 59/12* | (2023.01) |

(52) U.S. Cl.
CPC ............ *H05K 5/0217* (2013.01); *B32B 3/14* (2013.01); *B32B 3/266* (2013.01); *B32B 7/12* (2013.01); *B32B 15/08* (2013.01); *B32B 15/18* (2013.01); *B32B 15/20* (2013.01); *B32B 17/06* (2013.01); *B32B 27/06* (2013.01); *B32B 2307/412* (2013.01); *B32B 2307/546* (2013.01); *B32B 2309/105* (2013.01); *H10K 59/12* (2023.02)

(58) Field of Classification Search
CPC .......................... H05K 5/0017; H05K 5/0217
USPC ........................ 361/807, 809, 810
See application file for complete search history.

(56) References Cited

U.S. PATENT DOCUMENTS

| | | | |
|---|---|---|---|
| 10,602,623 B1 * | 3/2020 | Myers | .................. G06F 1/1652 |
| 2018/0103552 A1 * | 4/2018 | Seo | ....................... H05K 5/0017 |
| 2020/0043383 A1 * | 2/2020 | Yang | ......................... B32B 3/30 |

FOREIGN PATENT DOCUMENTS

| | | |
|---|---|---|
| CN | 113037895 | 6/2021 |
| KR | 10-2020-0124793 | 11/2020 |

* cited by examiner

*Primary Examiner* — Hung S. Bui
(74) *Attorney, Agent, or Firm* — F. CHAU & ASSOCIATES, LLC

(57) ABSTRACT

A display device includes a display panel having a first display area and a second display area adjacent to the first display area. A first support member is disposed under the display panel and includes a first support layer overlapping the first display area and a second support layer overlapping the second display area. The second support layer has a thickness different from a thickness of the first support layer. A second support member is movable under the first support member from the first display area to the second display area or from the second display area to the first display area.

20 Claims, 14 Drawing Sheets

DISPLAY DEVICE

CROSS-REFERENCE TO RELATED APPLICATION

This application claims priority under 35 U.S.C. § 119 to Korean Patent Application No. 10-2022-0027665, filed on Mar. 3, 2022 in the Korean Intellectual Property Office, the disclosure of which is incorporated by reference in its entirety herein.

1. TECHNICAL FIELD

Embodiments of the present disclosure relate generally to a display device. More particularly, embodiments of the present disclosure relate to a display device that provides visual information.

2. DISCUSSION OF RELATED ART

A display device provides images and may serve as a connecting medium between a user and information. Accordingly, display devices have becoming increasingly important along with the advancement of information technology. For example, the use of display devices such as liquid crystal display device (LCD), organic light emitting display device (OLED), plasma display device (PDP), quantum dot display device, and the like is increasing.

Recently, there is a demand for a flexible display device that can be bent. For example, the flexible display device such as a foldable display device or a slidable display device is used.

SUMMARY

Embodiments of the present disclosure provide a display device with increased reliability.

According to an embodiment of the present disclosure, a display device includes a display panel having a first display area and a second display area adjacent to the first display area. A first support member is disposed under the display panel and includes a first support layer overlapping the first display area and a second support layer overlapping the second display area. The second support layer has a thickness different from a thickness of the first support layer. A second support member is disposed under the first support member and is movable from the first display area to the second display area or from the second display area to the first display area.

In an embodiment, the thickness of the first support layer may be greater than the thickness of the second support layer.

In an embodiment, each of the first support member and the second support member may include a metal material.

In an embodiment, the second support member may include an electromagnet.

In an embodiment, when the second support member moves from the first display area to the second display area, a portion of the second support member may overlap the first display area.

In an embodiment, the second support layer may include a plurality of stretchable portions having a lattice shape in a plan view.

In an embodiment, each of the stretchable portions may include: a plurality of openings having a shape extending longitudinally in a first direction and arranged in the first direction and a second direction orthogonal to the first direction.

In an embodiment, the second support member may include: a third support layer overlapping the first display area and a fourth support layer movable from the first display area to the second display area or from the second display area to the first display area.

In an embodiment, when the fourth support layer is positioned in the first display area, the second support member may have a rectangular shape in a plan view.

In an embodiment, the third support layer and the fourth support layer may have shapes that interlock with each other in a plan view.

In an embodiment, when the fourth support layer moves from the first display area to the second display area, a portion of the fourth support layer may overlap the first display area.

In an embodiment, the display device may further include: an adhesive member including a first adhesive layer disposed on the first display area between the display panel and the first support member and a second adhesive layer disposed on the second display area between the display panel and the second support member.

In an embodiment, a thickness of the first adhesive layer may be less than a thickness of the second adhesive layer.

According to an embodiment of the present disclosure, a display device includes a display panel having a first display area and a second display area adjacent to the first display area in a first direction. A first support member is disposed under the display panel and includes a first support layer and a second support layer. The first and second support layers each including a bottom surface that is positioned on a same plane as each other. A second support member is disposed under the first support member and movable in the first direction from the first display area to the second display area or from the second display area to the first display area.

In an embodiment, the first support layer overlaps the first display area, and the second support layer may overlap the second display area.

In an embodiment, a thickness of the first support layer may be greater than a thickness of the second support layer.

In an embodiment, when the second support member moves from the first display area to the second display area, a portion of the second support member may overlap the first display area.

In an embodiment, each of the first support member and the second support member may include a metal material.

In an embodiment, the second support layer may include a plurality of stretchable portions having a lattice shape in a plan view.

In an embodiment, each of the stretchable portions may include: a plurality of openings having a shape extending longitudinally in a second direction orthogonal to the first direction and arranged in the first direction and the second direction.

A display device according to an embodiment may include a display panel including a first display area and a second display area adjacent to the first display area, a first support member disposed under the display panel and including a first support layer overlapping the first display area, and a second support layer overlapping the second display area and having a thickness different from a thickness of the first support layer, and a second support member movable under the first support member. The thickness of the first support layer may be greater that the thickness of the second support layer. Accordingly, when a portion of the display device overlapping the second display area is exposed to the outside, stress applied to the display panel may be reduced. In addition, the overall weight of the display device may be reduced.

BRIEF DESCRIPTION OF THE DRAWINGS

Illustrative, non-limiting embodiments of the present disclosure will be more clearly understood from the following detailed description in conjunction with the accompanying drawings.

DETAILED DESCRIPTION OF EMBODIMENTS

Figure 1:
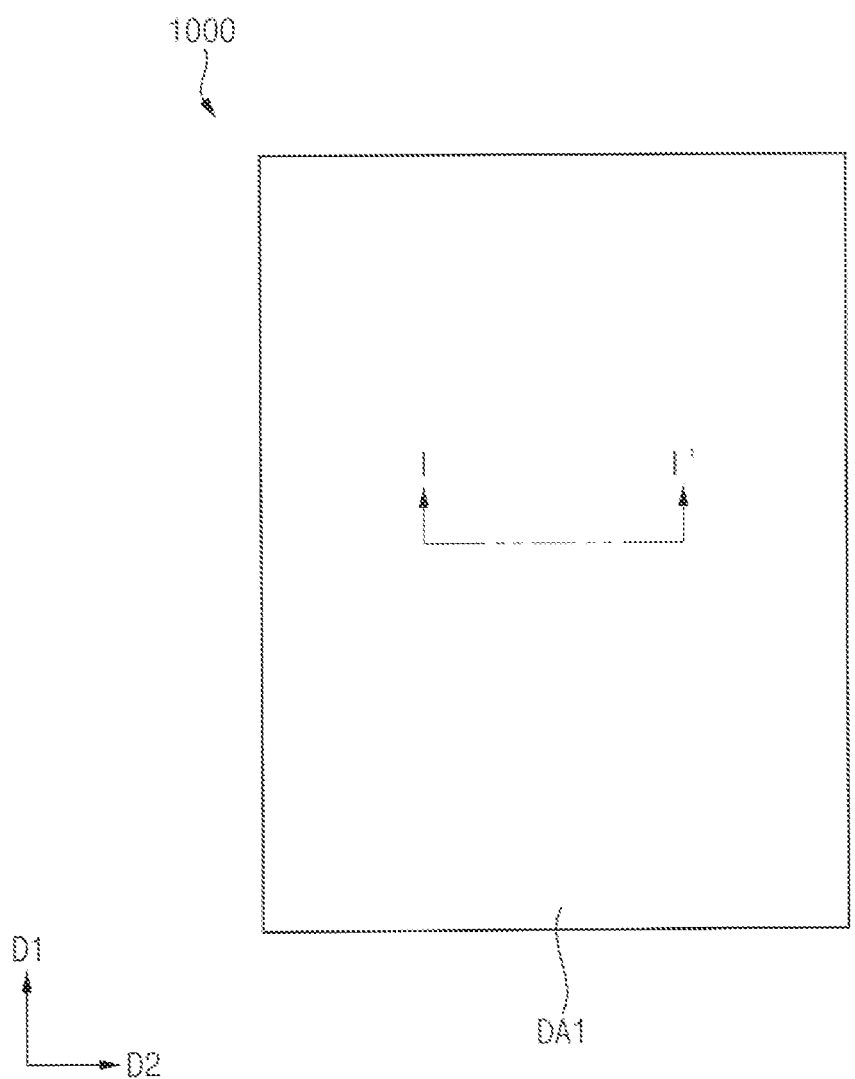
FIG. 1 is a plan view illustrating a first state of a display device according to an embodiment of the present disclosure.

Hereinafter, embodiments of the present disclosure will be explained in detail with reference to the accompanying drawings. The same reference numerals are used for the same components in the drawings, and redundant descriptions of the same components will be omitted for economy of description.

Figure 2:
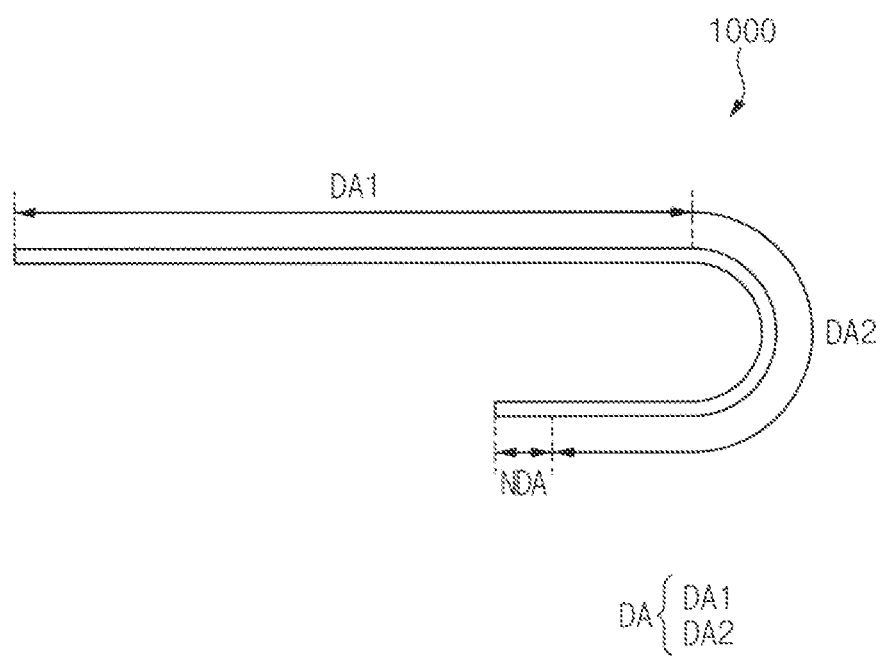
FIG. 2 is a side view illustrating the display device of FIG. 1 according to an embodiment of the present disclosure.
Figure 3:
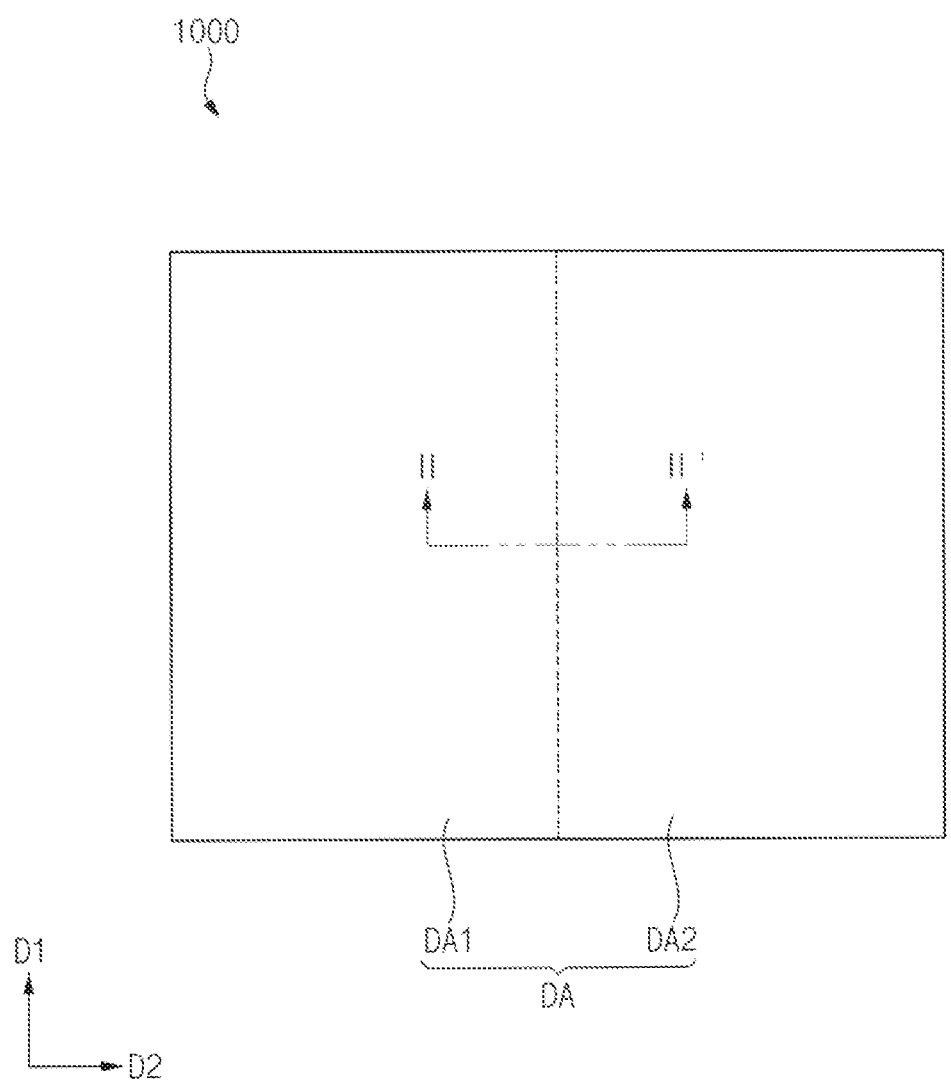
FIG. 3 is a plan view illustrating a second state of a display device according to an embodiment of the present disclosure.
Figure 4:
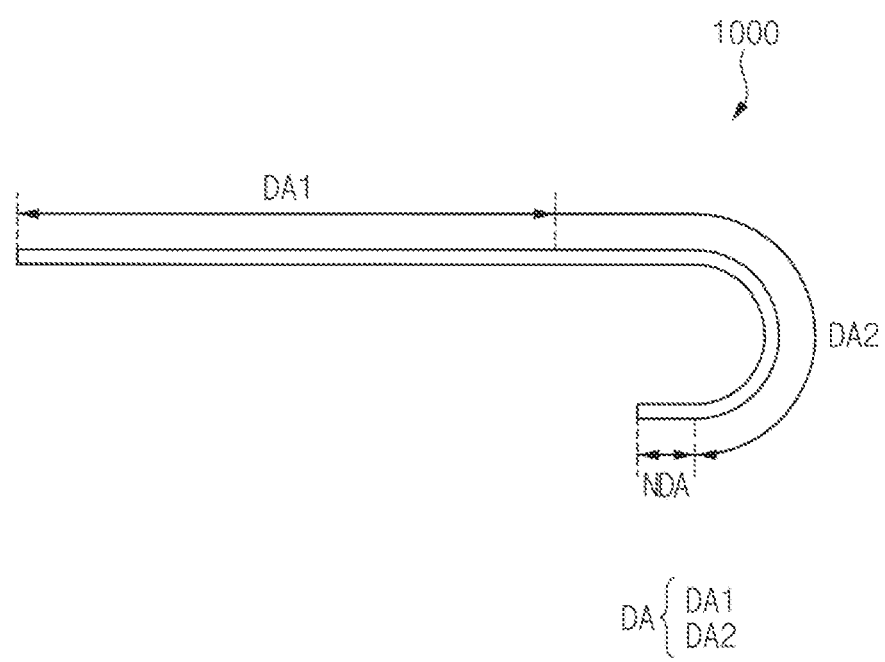
FIG. 4 is a side view illustrating the display device of FIG. 3 according to an embodiment of the present disclosure.

FIG. 1 is a plan view illustrating a first state of a display device according to an embodiment. FIG. 2 is a side view illustrating the display device of FIG. 1. FIG. 3 is a plan view illustrating a second state of a display device according to an embodiment. FIG. 4 is a side view illustrating the display device of FIG. 3.

Referring to FIGS. 1, 2, 3, and 4, the display device 1000 according to an embodiment may include a display area DA and a non-display area NDA. In an embodiment, the display area DA may include a first display area DA1 and a second display area DA2. For example, the second display area DA2 may be positioned adjacent to the first display area DA1 (e.g., in the second direction D2). However, embodiments of the present disclosure are not necessarily limited thereto and the numbers of the display area DA and the arrangement thereof may vary.

A plurality of pixels may be disposed in the display area DA. The plurality of pixels may emit light. For example, in an embodiment each of the plurality of pixels may include a red sub-pixel emitting red light, a green sub-pixel emitting green light, and a blue sub-pixel emitting blue light. As the red light, the green light, and the blue light are combined, the display device 1000 may display an image in the display area DA. For example, the first display area DA1 and the second display area DA2 may display an image. However, embodiments of the present disclosure are not necessarily limited thereto and the numbers and colors of the plurality of pixels may vary.

The non-display area NDA may be positioned around the display area DA. For example, the non-display area NDA may be positioned adjacent to the second display area DA2. In an embodiment, a driver may be disposed in the non-display area NDA. The driver may provide a signal and/or a voltage to the plurality of pixels. For example, the driver may include a gate driver, a data driver, and the like. The non-display area NDA may not display an image. For example, the driver may be bent toward a bottom of the display device 1000 to overlap the first display area DA1 (e.g., in a thickness direction of the display device 1000) so as not to be viewed in a plan view of the display device 1000.

The display device 1000 may be a flexible display device. For example, the display device 1000 may be a foldable display device or a slidable display device. In an embodiment, the display device 1000 may be the slidable display device. In this embodiment, the display device 1000 may have a first state and a second state.

A first portion of the display device 1000 disposed in the first display area DA1 may be arranged parallel to a plane in the first state and the second state. For example, the first portion of the display device 1000 disposed in the first display area DA1 may not be bent. Accordingly, the first portion of the display device 1000 disposed in the first display area DA1 in the first state and the second state may be viewed in a plan view.

A second portion of the display device 1000 disposed in the second display area DA2 may be bent toward a bottom surface of the display device 1000 in the first state. Accordingly, in the first state, the second portion of the display device 1000 disposed in the second display area DA2 may not be viewed in a plan view.

The second portion of the display device 1000 disposed in the second display area DA2 may be exposed to the outside in the second state. For example, in the second state, the second portion of the display device 1000 disposed in the second display area DA2 may be viewed in a plan view.

Accordingly, the display device 1000 may display a relatively small image in the first state and may display a relatively large image in the second state.

In an embodiment, the display device 1000 of the present disclosure may include an organic light emitting display device (OLED), a liquid crystal display device (LCD), a field emission display device (FED), a plasma display device (PDP), an electrophoretic display device (EPD), a quantum dot display device, or an inorganic light emitting display device. However, embodiments of the present disclosure are not necessarily limited thereto.

Figure 5:
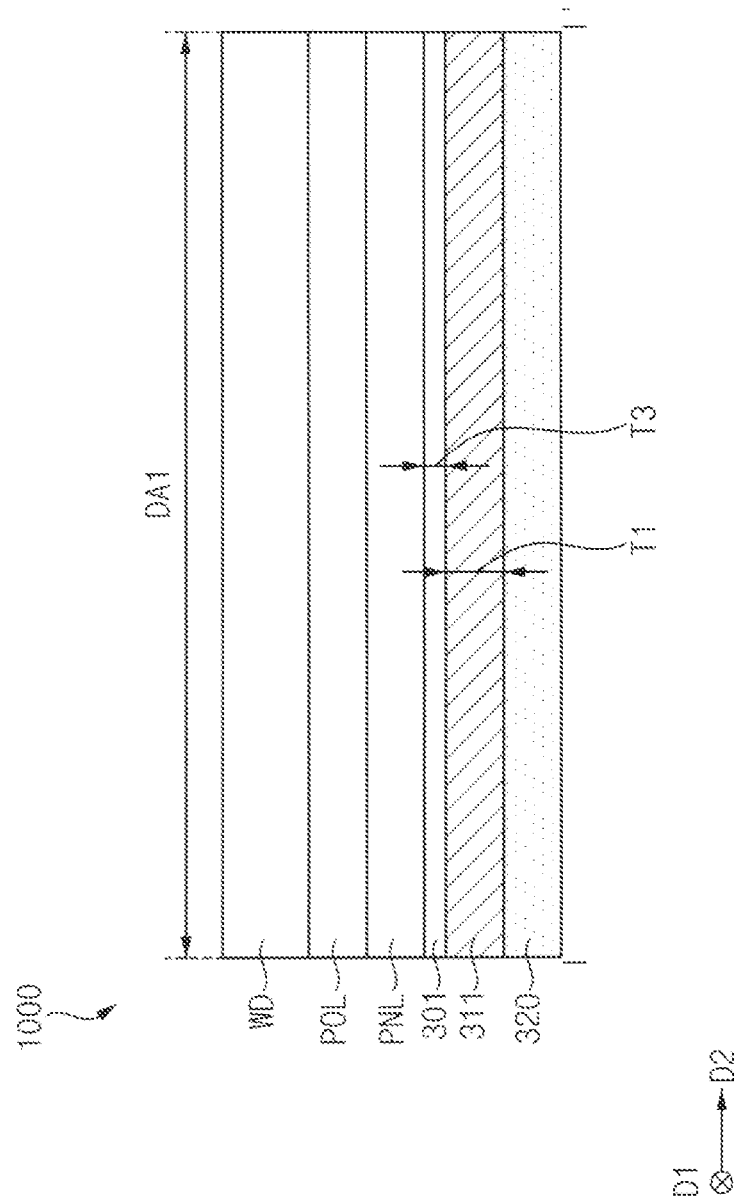
FIG. 5 is a cross-sectional view taken along line I-I' of FIG. 1 according to an embodiment of the present disclosure.
Figure 6:
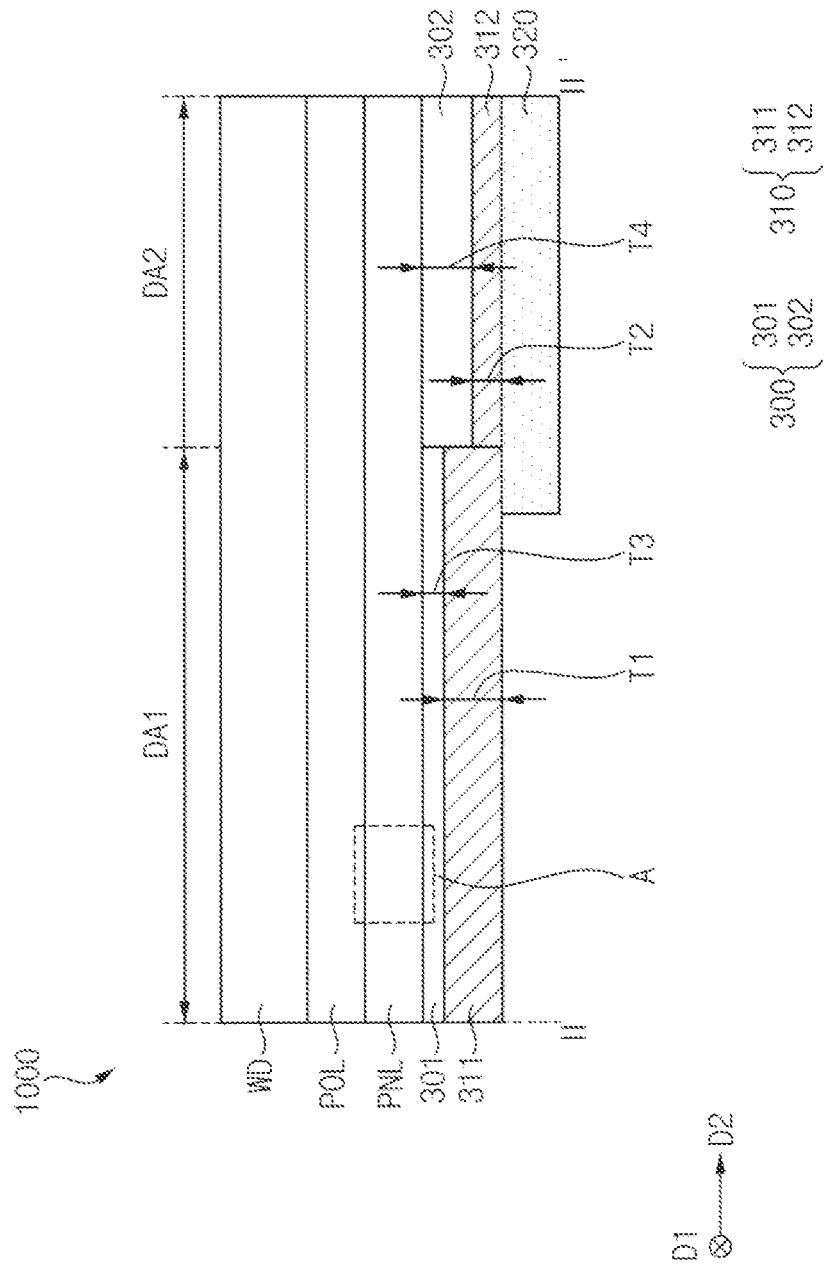
FIG. 6 is a cross-sectional view taken along line II-II' of FIG. 3 according to an embodiment of the present disclosure.
Figure 7:
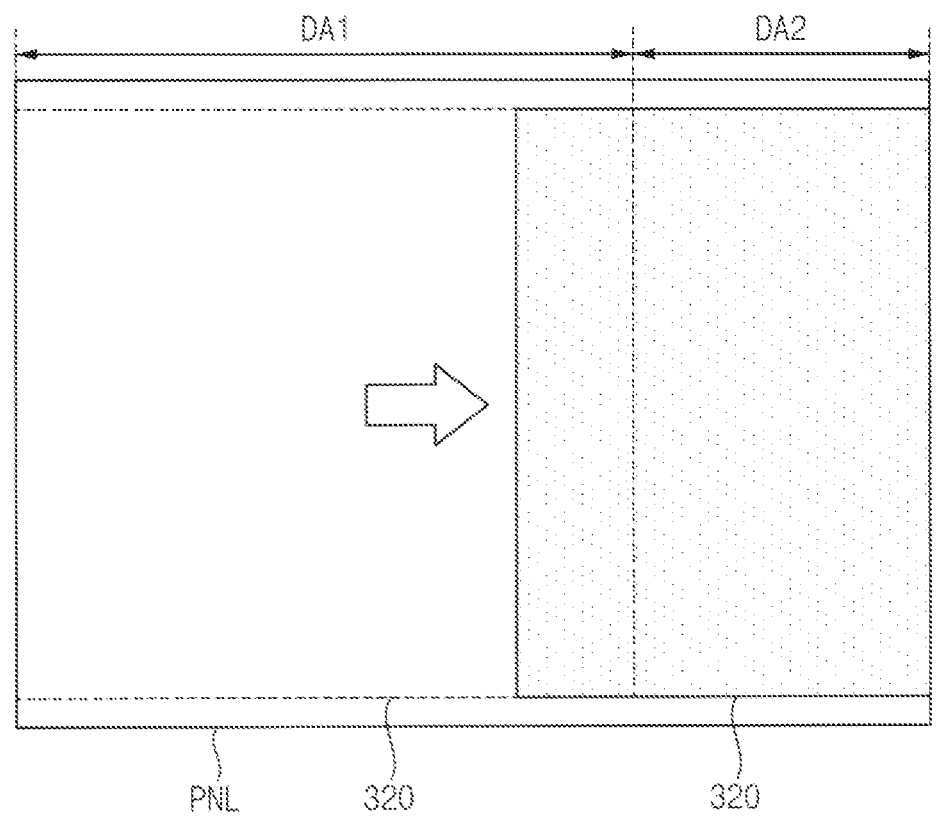
FIG. 7 is a bottom view illustrating a state in which a second support member included in the display device of FIGS. 5 and 6 moves according to an embodiment of the present disclosure.

FIG. 5 is a cross-sectional view taken along line I-I' of FIG. 1. FIG. 6 is a cross-sectional view taken along line II-II' of FIG. 3. FIG. 7 is a bottom view illustrating a state in which a second support member included in the display device of FIGS. 5 and 6 moves.

Referring to FIGS. 5, 6, and 7, the display device 1000 according to an embodiment includes a window member WD, a polarization member POL, a display panel PNL, an adhesive member 300, a first support member 310 and a second support member 320.

As described with reference to FIGS. 1, 2, 3, and 4, the display device 1000 may include the display area DA and the non-display area NDA, and the display area DA may include the first display area DA1 and the second display area DA2. Accordingly, the display panel PNL may also include the first display area DA1 and the second display area DA2.

The polarization member POL may be disposed on the display panel PNL (e.g., disposed directly thereon in a thickness direction of the display device 1000). The polarization member POL may block light incident from the outside. However, embodiments of the present disclosure are not necessarily limited thereto. For example, in an embodiment the polarization member POL may be omitted. In this embodiment, a color filter may be disposed on the display panel PNL (e.g., disposed directly thereon in a thickness direction of the display device 1000). The color filter may perform the same function as the polarization member POL. For example, the color filter may block light incident from the outside.

The window member WD may be disposed on the polarization member POL (e.g., disposed directly thereon in a thickness direction of the display device 1000). The window member WD may constitute a front surface of the display device 1000 and may protect the display panel PNL from external impacts, scratches, etc. The window member WD may have a transmissive portion corresponding to the display area DA. The window member WD may include a transparent material. For example, in an embodiment the window member WD may include a polymer material, a glass thin film, or a combination thereof to be bendable. However, materials that may be included in the window member WD are not necessarily limited thereto.

The adhesive member 300 may be disposed under the display panel PNL. The adhesive member 300 may include a first adhesive layer 301 disposed in the first display area DA1 and a second adhesive layer 302 disposed in the second display area DA2. In an embodiment, the first adhesive layer 301 may directly contact a bottom surface of the display panel PNL disposed in the first display area DA1, and the second adhesive layer 302 may directly contact a bottom surface of the display panel PNL disposed in the second display area DA2.

A thickness T3 of the first adhesive layer 301 may be different from a thickness T4 of the second adhesive layer 302. In an embodiment, the thickness T3 of the first adhesive layer 301 may be less than the thickness T4 of the second adhesive layer 302.

For example, in an embodiment the adhesive member 300 may include an optical clear adhesive (OCA), a pressure sensitive adhesive (PSA), a photocurable resin, a thermosetting resin, and the like. These may be used alone or in combination with each other.

The first support member 310 may be disposed under the adhesive member 300. The first support member 310 may serve to support the display panel PNL. In addition, the first support member 310 may serve to help the display panel PNL to be bent. The first support member 310 may include a first support layer 311 disposed in the first display area DA1 and a second support layer 312 disposed in the second display area DA2. The first support layer 311 may directly contact a bottom surface of the first adhesive layer 301, and the second support layer 312 may directly contact a bottom surface of the second adhesive layer 302. For example, in an embodiment upper surfaces of the first and second support layers 311, 312, may directly contact bottom surfaces of the first and second adhesive layers 301, 302, respectively.

A thickness T1 of the first support layer 311 may be different from a thickness T2 of the second support layer 312. In an embodiment, the thickness T1 of the first support layer 311 may be greater than the thickness T2 of the second support layer 312. Accordingly, the surface quality of the display panel PNL may be maintained. For example, in an embodiment the thickness T1 of the first support layer 311 may be about 0.3 mm, and the thickness T2 of the second support layer 312 may be about $5 \times 10^{-5}$ mm or less. However, the thickness T1 of the first support layer 311 and the thickness T2 of the second support layer 312 are not necessarily limited thereto.

In an embodiment, the sum of the thickness T3 of the first adhesive layer 301 and the thickness T1 of the first support layer 311 may be substantially equal to the sum of the thickness T4 of the second adhesive layer 302 and the thickness T2 of the second support layer 312. For example, a bottom surface of the first support layer 311 and a bottom surface of the second support layer 312 may be positioned on the same plane.

In an embodiment, the first support member 310 may include a metal material. For example, in an embodiment the first support member 310 may include invar, which is an alloy of nickel and iron, stainless steel (SUS), titanium, copper, and the like. These may be used alone or in combination with each other. Alternatively, the first support member 310 may include glass or plastic.

In an embodiment, the second support member 320 may be disposed under the first support member 310. In an embodiment, the second support member 320 may include a material as described above with respect to the first support member 310. In this embodiment, a segmented body that is disposed under the first support member 310, is disposed in the second display area DA2, and has a form of a metal bar supporting the display panel PNL may be omitted.

As described with reference to FIGS. 1, 2, 3, and 4, the display device 1000 may have the first state and the second state. When the display device 1000 is in the first state, the first portion of the display device 1000 disposed in the first display area DA1 may be viewed in a plan view. When the display device 1000 is in the second state, the first portion of the display device 1000 disposed in the first display area DA1 and the second portion of the display device 1000 disposed in the second display area DA2 may be viewed in a plan view.

The second support member 320 may be movable between the first display area DA1 and the second display area DA2. For example, as shown in FIG. 7, the second support member 320 may move from the first display area DA1 to the second display area DA2 (e.g., move in the second direction D2). For example, in an embodiment, when the display device 1000 is in the first state, the second support member 320 may be positioned in the first display area DA1. When the display device 1000 is in the second state, the second support member 320 may be positioned in the second display area DA2.

In an embodiment, when the second support member 320 moves from the first display area DA1 to the second display area DA2, a portion of the second support member 320 may be disposed in the first display area DA1. However, embodiments of the present disclosure are not necessarily limited thereto. For example, in an embodiment, when the second support member 320 moves from the first display area DA1 to the second display area DA2, the second support member 320 is not disposed in the first display area DA1.

In an embodiment, the second support member 320 may include an electromagnetic material (e.g., an electromagnet). In this case, when the display device 1000 is in the second state, the second support member 320 may adhere the second support layer 312 to a magnetic force. Accordingly, a lifting phenomenon of the display panel PNL disposed in the second display area DA2 may be increased.

In a comparative embodiment, a slidable display including a first display area and a second display area may include the segmented body disposed under a display panel to support the display panel, disposed in the second display area, and having a metal bar shape. However, since the segment body must have a predetermined thickness or more, a weight of the display device may increase. In addition, when a portion of the display device disposed in the second display area is exposed to the outside, stress may be applied to the display panel. Accordingly, damage may be applied to the display panel.

The display device 1000 according to an embodiment may include the display panel PNL including the first display area DA1 and the second display area DA2 adjacent to the first display area DA1 (e.g., in the second direction D2), the first support member 310 disposed under the display panel PNL and including the first support layer 311 disposed in the first display area DA1, and the second support layer 312 disposed in the second display area DA2 and having the thickness T2 different from the thickness T1 of the first support layer 311, and the second support member 320 movable under the first support member 310. The thickness T1 of the first support layer 311 may be greater that the thickness T2 of the second support layer 312. Accordingly, when the display device 1000 is changed from the first state to the second state (e.g., when the second portion of the display device 1000 disposed in the second display area DA2 is exposed to the outside), stress applied to the display panel PNL may be reduced. In addition, since display device 1000 does not include a segmented body, the overall weight of the display device may be reduced.

Figure 8:
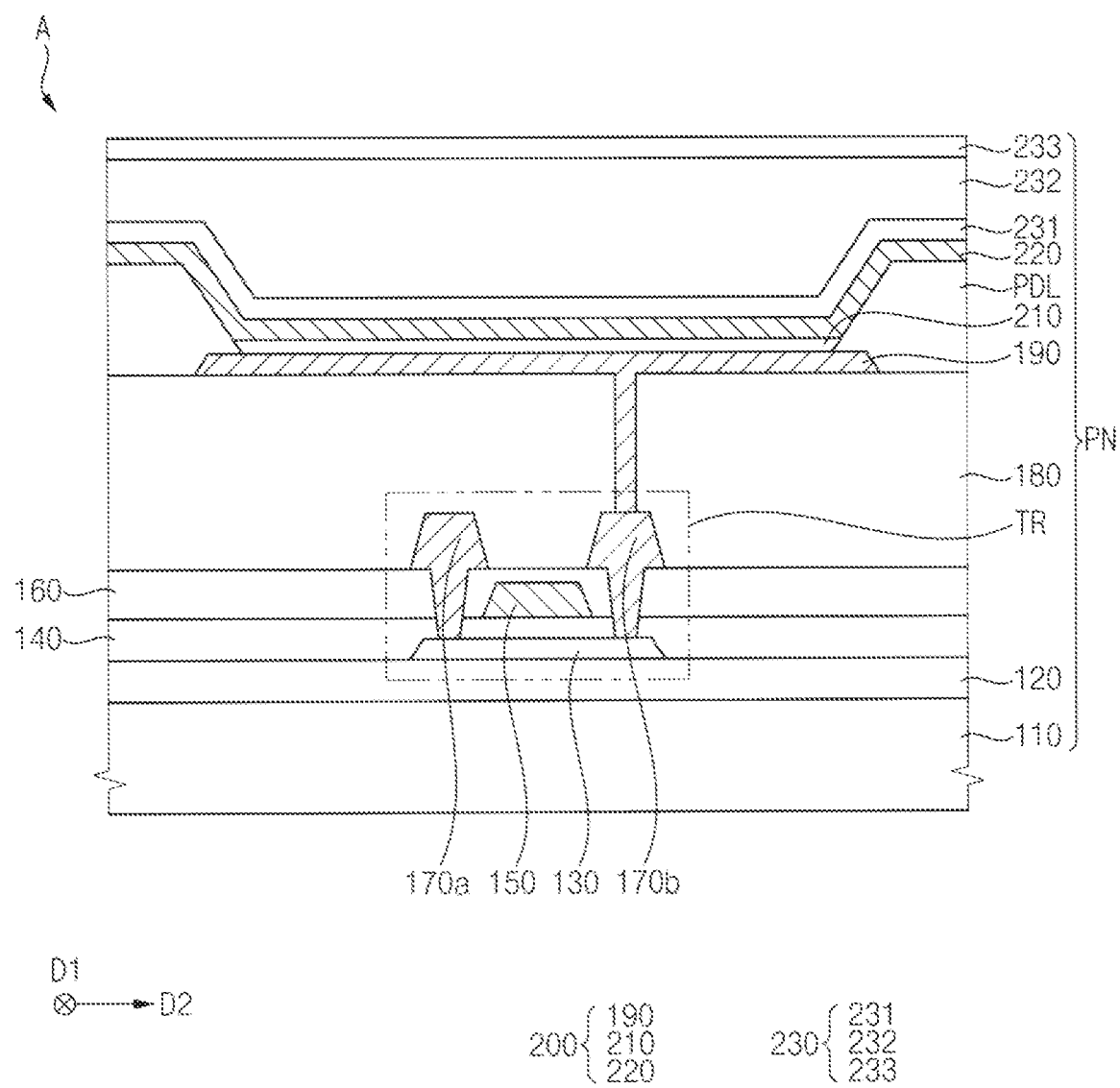
FIG. 8 is an enlarged cross-sectional view of area "A" of FIG. 6 according to an embodiment of the present disclosure.

FIG. 8 is an enlarged cross-sectional view of area "A" of FIG. 6. For example, FIG. 8 is an enlarged cross-sectional view of the first display area DA1 of the display panel PNL of FIG. 6.

Referring to FIG. 8, the display panel PNL may include a substrate 110, a buffer layer 120, a gate insulating layer 140, an interlayer insulating layer 160, a transistor TR, a planarization layer 180, a pixel defining layer PDL, a light emitting element 200 and an encapsulation layer 230.

The transistor TR includes an active layer 130, a gate electrode 150, a source electrode 170a, and a drain electrode 170b. The light emitting element 200 may include a lower electrode 190, a light emitting layer 210, and an upper electrode 220. In addition, the encapsulation layer 230 may include a first thin film encapsulation layer 231, a second thin film encapsulation layer 232, and a third thin film encapsulation layer 233.

The substrate 110 may include a transparent material or an opaque material. In an embodiment, the substrate 110 may include a flexible transparent resin substrate. An example of the transparent resin substrate that can be used as the substrate 110 may be a polyimide substrate. Alternatively, the substrate 110 may include a quartz substrate, a synthetic quartz substrate, a calcium fluoride substrate, a soda lime glass substrate, an alkali-free glass substrate, and the like. These may be used alone or in combination with each other. However, embodiments of the present disclosure are not necessarily limited thereto.

The buffer layer 120 may be disposed on the substrate 110 (e.g., disposed directly thereon in a thickness direction of the display device 1000). The buffer layer 120 may prevent diffusion of metal atoms or impurities from the substrate 110 to the transistor TR. For example, in an embodiment the buffer layer 120 may include an inorganic material such as oxide or nitride.

The active layer 130 may be disposed on the buffer layer 120 (e.g., disposed directly thereon in a thickness direction of the display device 1000). In an embodiment, the active layer 130 may include a metal oxide semiconductor, an inorganic semiconductor (e.g., amorphous silicon, polysilicon, or the like), or an organic semiconductor. The active layer 130 has a source region, a drain region, and a channel region positioned between the source region and the drain region (e.g., in the second direction D2).

The gate insulating layer 140 may be disposed on the buffer layer 120 (e.g., disposed directly thereon in a thickness direction of the display device 1000). The gate insulating layer 140 may sufficiently cover the active layer 130 on the substrate 110 and may have a substantially flat top surface without creating a step around the active layer 130. Alternatively, the gate insulating layer 140 may cover the active layer 130 on the substrate 110 and may be disposed along a profile of the active layer 130 with a uniform thickness.

For example, in an embodiment the gate insulating layer 140 may include a silicon compound, a metal oxide, and the like. Examples of the silicon compound that can be used as the gate insulating layer 140 may include silicon oxide ($SiO_x$), silicon nitride ($SiN_x$), silicon carbide ($SiC_x$), silicon oxynitride ($SiO_xN_y$), silicon oxycarbide ($SiO_xC_y$), and the like. Examples of the metal oxide that can be used as the gate insulating layer 140 may include aluminum oxide ($AlO_x$), gallium oxide ($GaO_x$), titanium oxide ($TiO_x$), zinc oxide ($ZnO_x$), tantalum oxide ($TaO_x$), and the like. Each of these may be used alone or in combination with each other. However, embodiments of the present disclosure are not necessarily limited thereto.

The gate electrode 150 may be disposed on the gate insulating layer 140 (e.g., disposed directly thereon in a thickness direction of the display device 1000). The gate electrode 150 may overlap the channel region of the active layer 130. For example, in an embodiment the gate electrode 150 may include a metal, an alloy, a metal nitride, a conductive metal oxide, a transparent conductive material, and the like. These may be used alone or in combination with each other. However, embodiments of the present disclosure are not necessarily limited thereto.

The interlayer insulating layer 160 may be disposed on the gate insulating layer 140 (e.g., disposed directly thereon in a thickness direction of the display device 1000). The interlayer insulating layer 160 may sufficiently cover the gate electrode 150 on the substrate 110 and may have a substantially flat top surface without creating a step around the gate electrode 150. Alternatively, the interlayer insulating layer 160 may cover the gate electrode 150 on the substrate 110 and may be disposed along a profile of the gate electrode 150 with a uniform thickness.

For example, in an embodiment the interlayer insulating layer 160 may include a silicon compound, a metal oxide, and the like. Examples of the silicon compound that can be used as the interlayer insulating layer 160 may include silicon oxide, silicon nitride, silicon carbide, silicon oxynitride, silicon oxycarbide, and the like. Examples of the metal oxide that can be used as the interlayer insulating layer 160 may include aluminum oxide, gallium oxide, titanium oxide, zinc oxide, tantalum oxide, and the like. Each of these may be used alone or in combination with each other. However, embodiments of the present disclosure are not necessarily limited thereto.

The source electrode 170a and a drain electrode 170b may be disposed on the interlayer insulating layer 160 (e.g., disposed directly thereon in a thickness direction of the display device 1000). The source electrode 170a may be connected to the source region of the active layer 130 through a contact hole extending through the gate insulating layer 140 and the interlayer insulating layer 160. The drain electrode 170b may be connected to the drain region of the active layer 130 through a contact hole extending through the gate insulating layer 140 and the interlayer insulating layer 160. For example, in an embodiment each of the source electrode 170a and the drain electrode 170b may include a metal, an alloy, a metal nitride, a conductive metal oxide, a transparent conductive material, and the like. These may be used alone or in combination with each other. However, embodiments of the present disclosure are not necessarily limited thereto.

Accordingly, the transistor TR including the active layer 130, the gate electrode 150, the source electrode 170a, and the drain electrode 170b may be disposed on the substrate 110.

The planarization layer 180 may be disposed on the interlayer insulating layer 160 (e.g., disposed directly thereon in a thickness direction of the display device 1000). The planarization layer 180 may sufficiently cover the source electrode 170a and the drain electrode 170b. The planarization layer 180 may include an organic material or an inorganic material. For example, in an embodiment the planarization layer 180 may include organic materials such as, a polyimide-based resin, a photoresist, a polyacryl-based resin, a polyimide-based resin, a siloxane-based resin, a siloxane-based resin, and the like. These may be used alone or in combination with each other.

The lower electrode 190 may be disposed on the planarization layer 180 (e.g., disposed directly thereon in a thickness direction of the display device 1000). The lower electrode 190 may be connected to the drain electrode 170b through a contact hole extending through a portion of the planarization layer 180. For example, in an embodiment the lower electrode 190 may include a metal, an alloy, a metal nitride, a conductive metal oxide, a transparent conductive material, and the like. These may be used alone or in combination with each other. However, embodiments of the present disclosure are not necessarily limited thereto.

The pixel defining layer PDL may be disposed on the planarization layer 180 (e.g., disposed directly thereon in a thickness direction of the display device 1000). The pixel defining layer PDL may include an opening exposing a portion of the lower electrode 190. For example, in an embodiment the pixel defining layer PDL may directly contact lateral edges of the lower electrode 190 and the opening may expose a central portion (e.g., in the second direction D2) of the lower electrode 190. The pixel defining layer PDL may include an organic material or an inorganic material. For example, in an embodiment the pixel defining layer PDL may include an organic material such as polyimide.

The light emitting layer 210 may be disposed on the lower electrode 190. For example, the light emitting layer 210 may be disposed in the opening of the lower electrode 190. The light emitting layer 210 may be formed using at least one of light emitting materials that emit different color lights (e.g., red light, green light, blue light, and the like) according to the sub-pixels. Alternatively, the light emitting layer 210 may emit white light as a whole by stacking a plurality of light emitting materials capable of generating different color lights such as red light, green light, and blue light. In this embodiment, a color filter may be disposed on the light emitting layer 210. The color filter may include at least one of a red color filter, a green color filter, and a blue color filter. However, embodiments of the present disclosure are not necessarily limited thereto. For example, in an embodiment the color filter may include a yellow color filter, a cyan color filter and a magenta color filter. The color filter may be made of a photosensitive resin.

The upper electrode 220 may be disposed on the pixel defining layer PDL and the light emitting layer 210. For example, in an embodiment the upper electrode 220 may include a metal, an alloy, a metal nitride, a conductive metal oxide, a transparent conductive material, and the like. These may be used alone or in combination with each other. However, embodiments of the present disclosure are not necessarily limited thereto.

Accordingly, the light emitting element 200 including the lower electrode 190, the light emitting layer 210, and the upper electrode 220 may be disposed on the substrate 110.

The first thin film encapsulation layer 231 may be disposed on the upper electrode 220. The first thin film encapsulation layer 231 may prevent the light emitting layer 210 from being deteriorated due to penetration of moisture, oxygen, or the like. In addition, the first thin film encapsulation layer 231 may protect the display panel PNL from external impact. In an embodiment the first thin film encapsulation layer 231 may include flexible inorganic materials.

The second thin film encapsulation layer 232 may be disposed on the first thin film encapsulation layer 231 (e.g., disposed directly thereon in a thickness direction of the display device 1000). The second thin film encapsulation layer 232 may increase the flatness of the display panel PN and may protect the display panel PNL. In an embodiment, the second thin film encapsulation layer 232 may include flexible organic materials.

The third thin film encapsulation layer 233 may be disposed on the second thin film encapsulation layer 232 (e.g., disposed directly thereon in a thickness direction of the display device 1000). The third thin film encapsulation layer 233 may prevent the light emitting layer 210 from being deteriorated due to penetration of moisture, oxygen, or the like together with the first thin film encapsulation layer 231. In addition, the third thin film encapsulation layer 233 may protect the display panel PNL together with the first thin film encapsulation layer 231 and the second thin film encapsulation layer 232 from external impact. In an embodiment, the third thin film encapsulation layer 233 may include flexible inorganic materials. However, embodiments of the present disclosure are not necessarily limited thereto and the encapsulation layer may include various different arrangements which include at least one organic layer and at least one inorganic layer.

Figure 9:
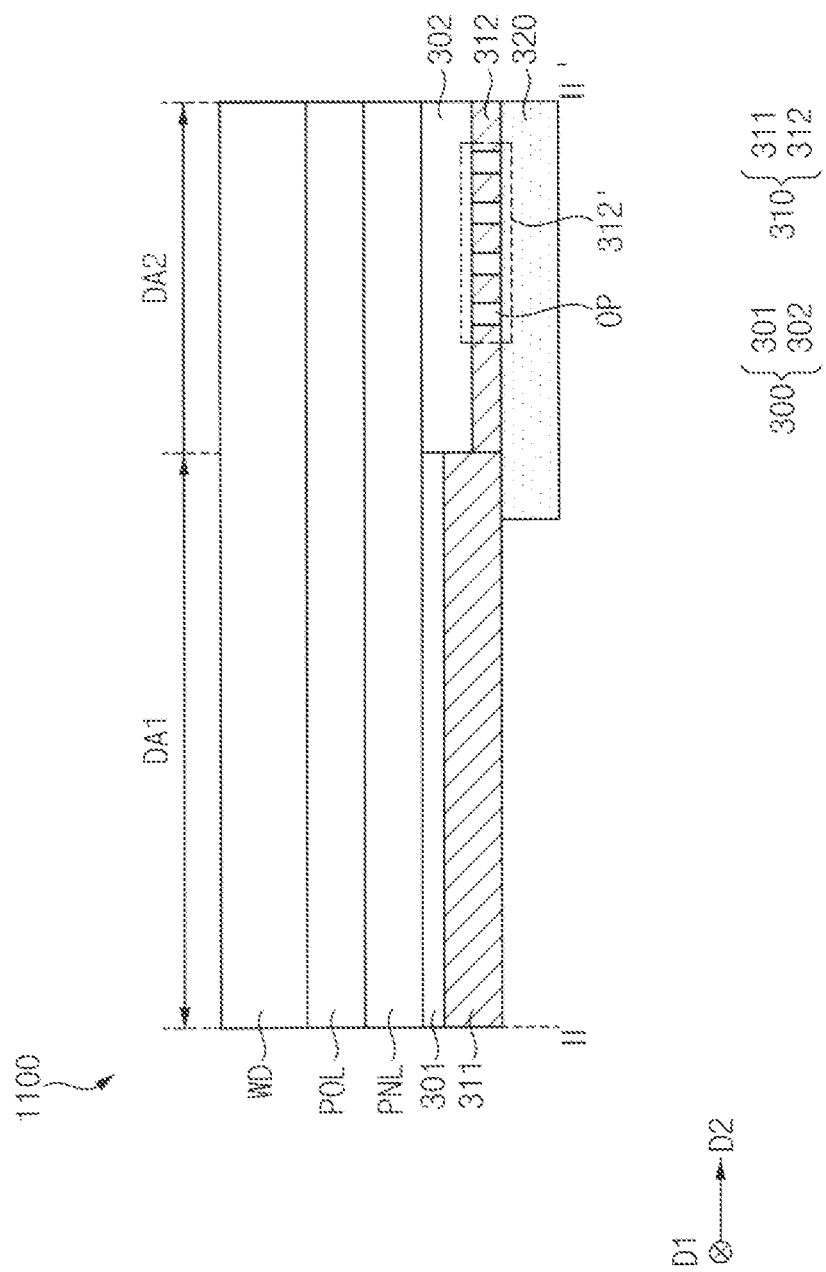
FIG. 9 is a cross-sectional view illustrating a display device according to an embodiment of the present disclosure.
Figure 10:
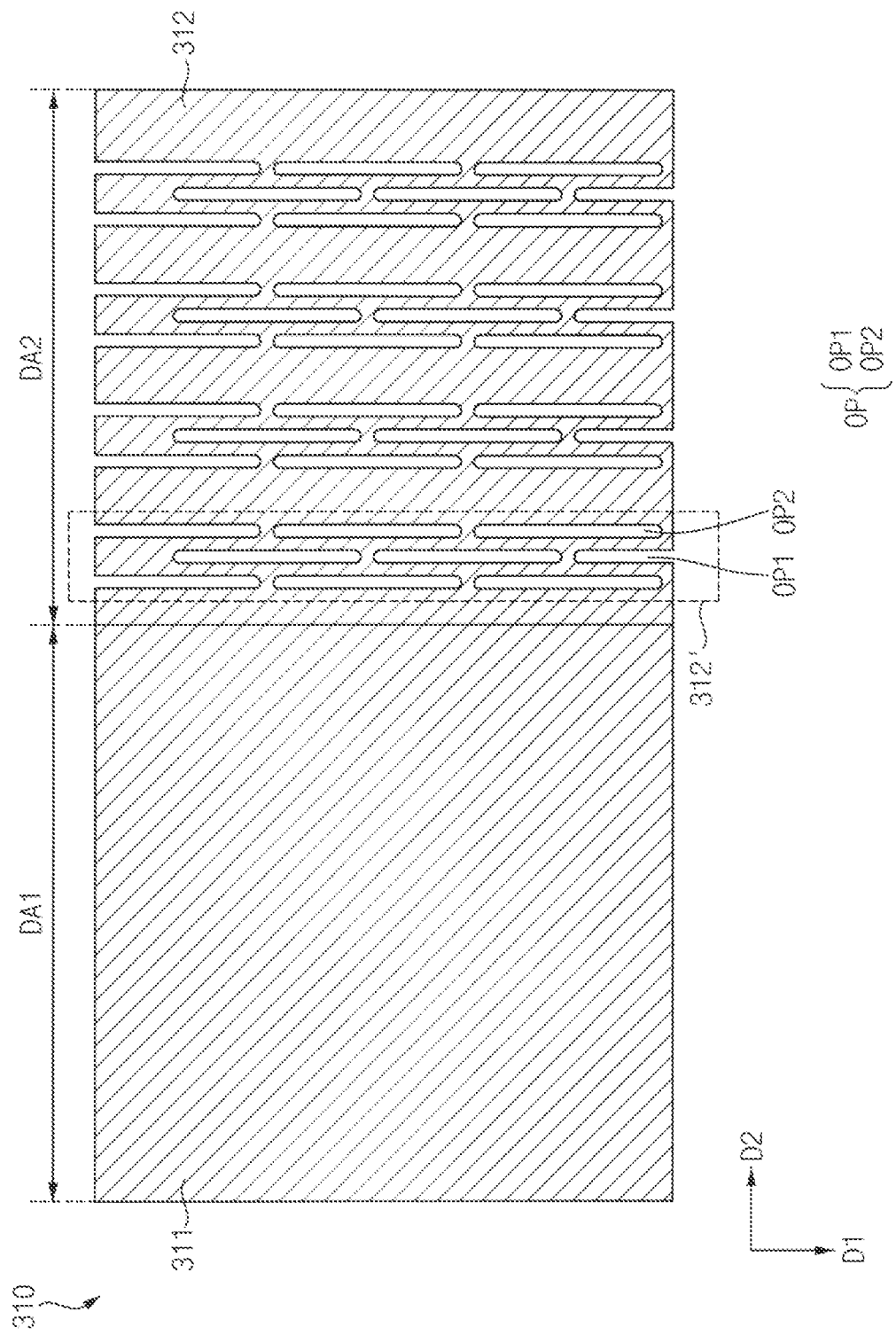
FIG. 10 is a bottom view illustrating a first support member included in the display device of FIG. 9 according to an embodiment of the present disclosure.

FIG. 9 is a cross-sectional view illustrating a display device according to an embodiment FIG. 10 is a bottom view illustrating a first support member included in the display device of FIG. 9.

Referring FIGS. 9 and 10, the display device 1100 according to an embodiment includes a window member WD, a polarization member POL, a display panel PNL, an adhesive member 300, a first support member 310 and a second support member 320. However, the display device 1100 described with reference to FIGS. 9 and 10 may be substantially the same or similar as the display device 1000 described with reference to FIGS. 5 and 6 except for some configurations of the first support member 310. Hereinafter, overlapping descriptions will be omitted for economy of description.

As described above, the first support member 310 may include the first support layer 311 disposed in the first display area DA1 and the second support layer 312 disposed in the second display area DA2. In an embodiment, the second support layer 312 may include a plurality of stretchable portions 312'. The plurality of stretchable portions 312' may have elasticity corresponding to folding and unfolding of the display device 1000 and may have a lattice shape. The plurality of stretchable portions 312' may help the display device 1000 to be folded or unfolded.

In an embodiment, the plurality of stretchable portions 312' may be arranged to be spaced apart from each other in the second direction D2. For example, each of the plurality of stretchable portions 312' may include a plurality of openings, such as first and second openings OP1 and OP2. However, embodiments of the present disclosure are not necessarily limited thereto and the number of the plurality of openings may vary.

In an embodiment, the plurality of openings may have a shape extending longitudinally in the first direction D1 and may be arranged in the first direction D1 and the second direction D2 perpendicular to the first direction D1. In addition, the second openings OP2 adjacent to the first openings OP1 in the second direction D2 may be shifted from the first openings OP1 in the second direction D2 so that the first and second openings OP1 and OP2 form an arrangement that is generally staggered from each other. However, embodiments of the present disclosure are not necessarily limited thereto and the arrangement of the plurality of openings may vary.

Figure 11:
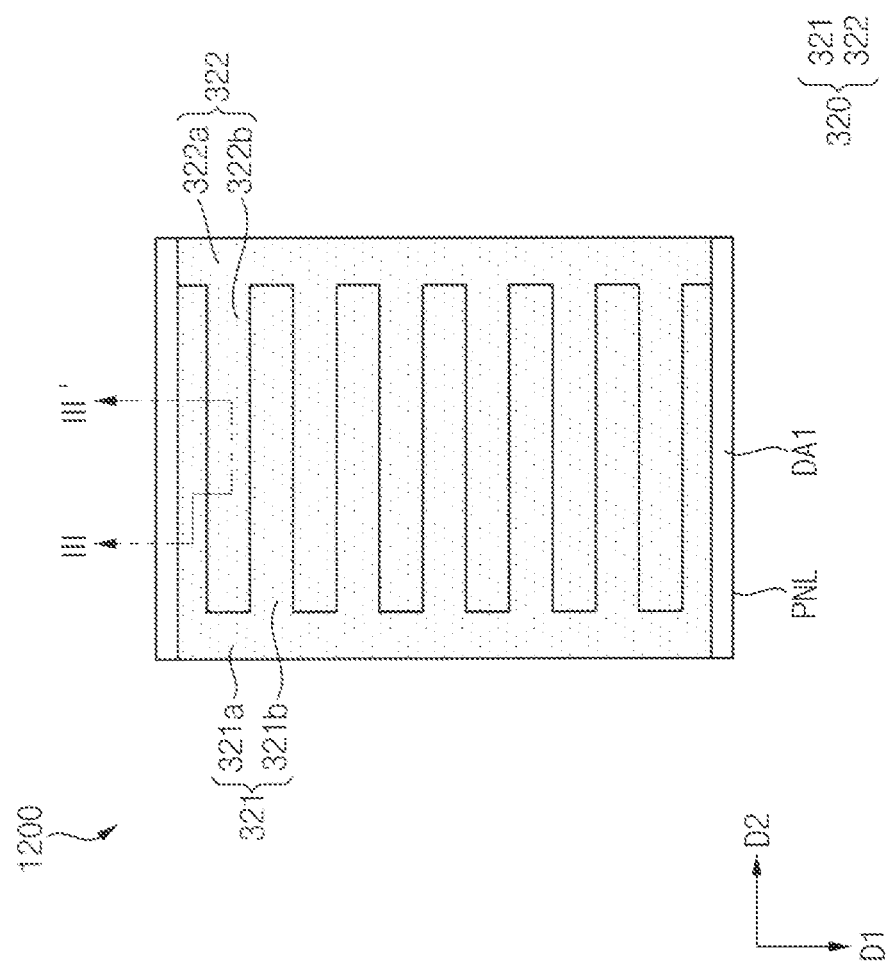
FIG. 11 is a bottom view illustrating a first state of a display device according to an embodiment of the present disclosure.
Figure 12:
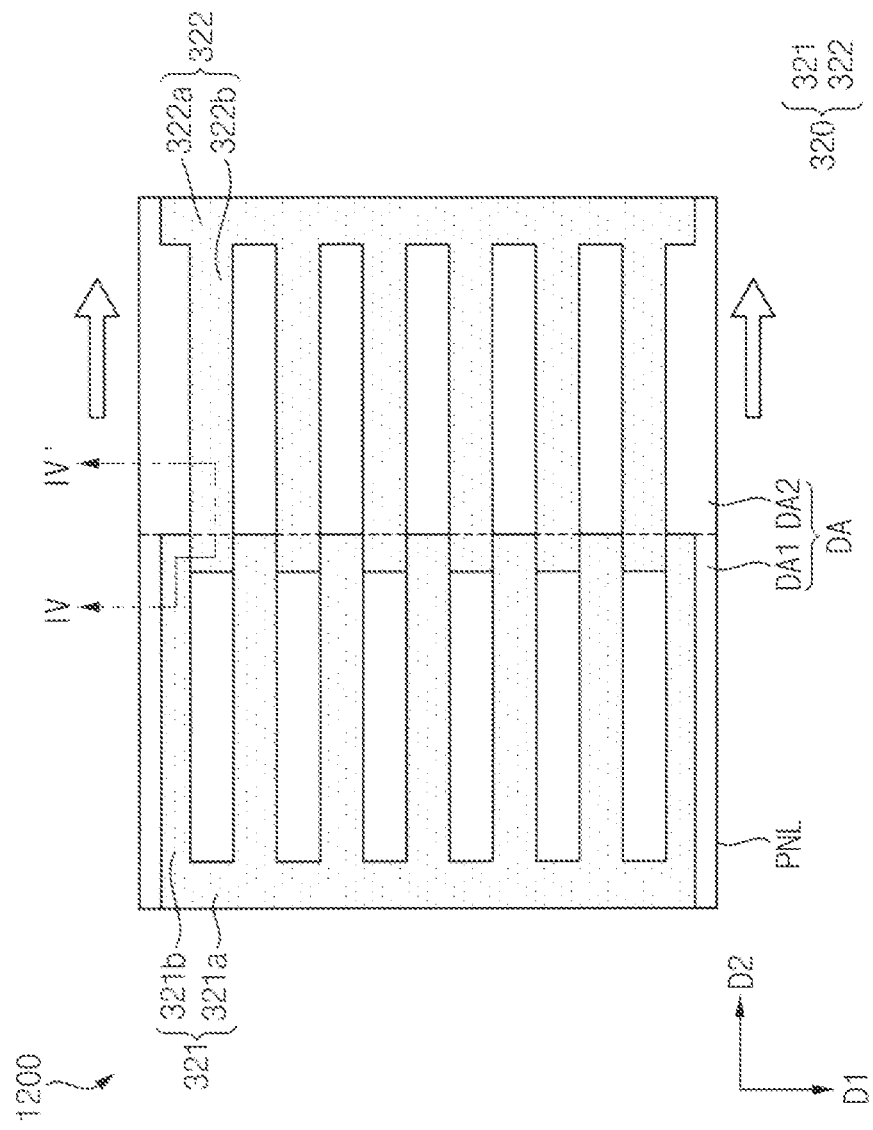
FIG. 12 is a bottom view illustrating a second state of a display device according to an embodiment of the present disclosure.
Figure 13:
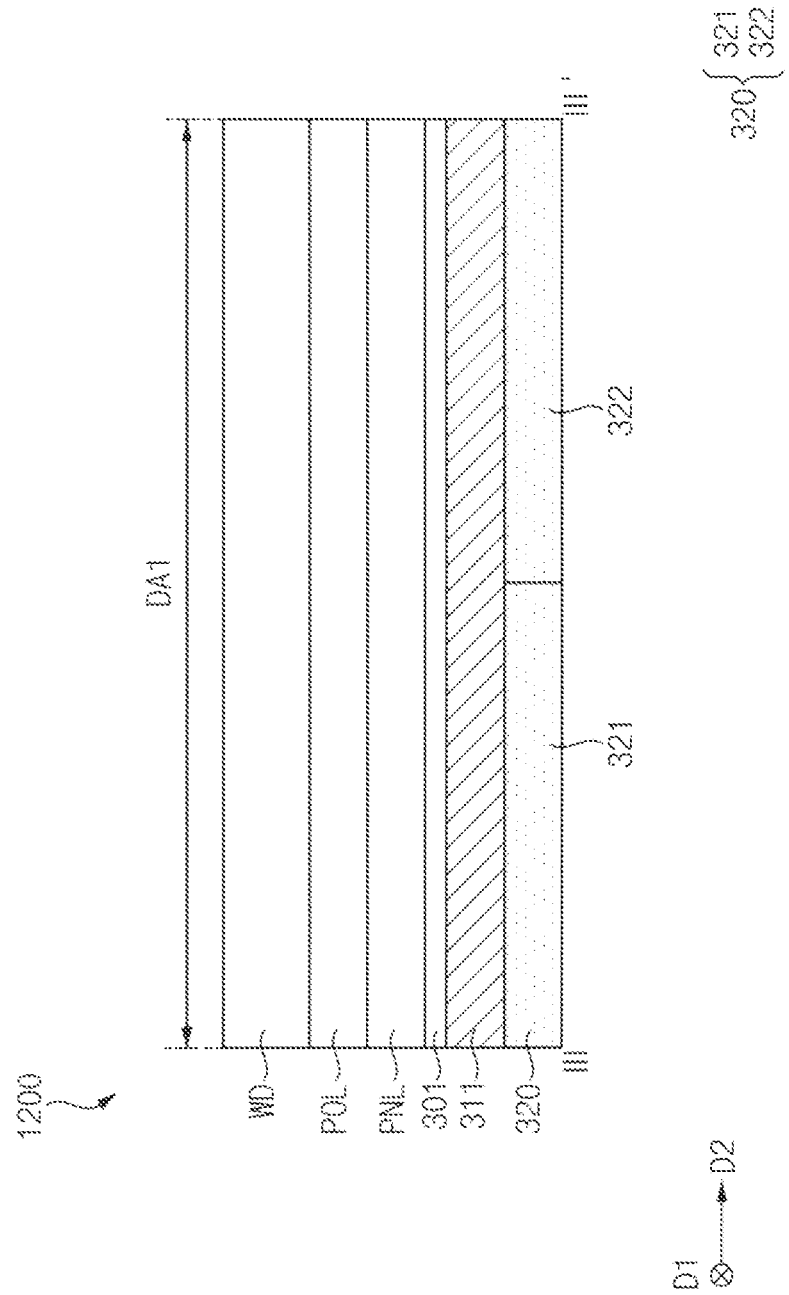
FIG. 13 is a cross-sectional view taken along line III-III' of FIG. 11 according to an embodiment of the present disclosure.
Figure 14:
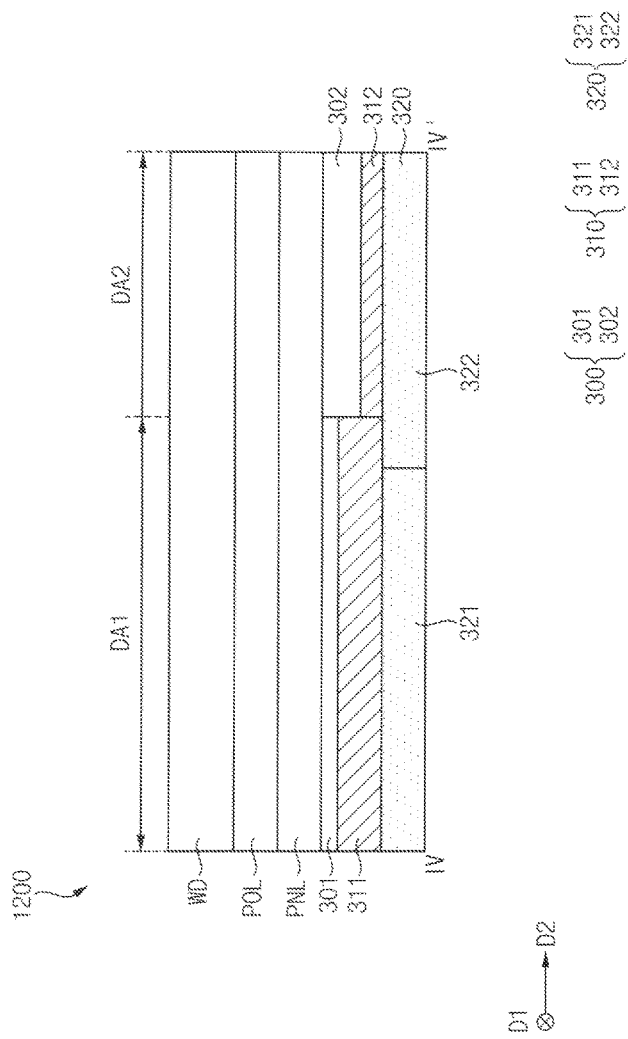
FIG. 14 is a cross-sectional view taken along line IV-IV' of FIG. 11 according to an embodiment of the present disclosure.

FIG. 11 is a bottom view illustrating a first state of a display device according to an embodiment. FIG. 12 is a bottom view illustrating a second state of a display device according to an embodiment. FIG. 13 is a cross-sectional view taken along line III-III' of FIG. 11. FIG. 14 is a cross-sectional view taken along line IV-IV' of FIG. 11.

Referring to FIGS. 11, 12, 13, and 14, the display device 1200 according to an embodiment may include a window member WD, a polarization member POL, a display panel PNL, an adhesive member 300, a first support member 310 and a second support member 320. However, the display device 1200 described with reference to FIGS. 11, 12, 13 and 14 may be substantially the same or similar as the display device 1000 described with reference to FIGS. 5 and 6 except for some configurations of the second support member 320. Hereinafter, overlapping descriptions will be omitted for economy of description.

The second support member 320 may be disposed under the first support member 310. The second support member 320 may be divided into two layers positioned on the same plane. In an embodiment, the second support member 320 may include a third support layer 321 and a fourth support layer 322. The third support layer 321 and fourth support layer 322 may be adjacent to each other (e.g., in the second direction D2).

The third support layer 321 may be disposed in the first display area DAL. The third support layer 321 may not move from the first display area DA1 to the second display area DA2. The fourth support layer 322 may be movable between the first display area DA1 and the second display area DA2. For example, the fourth support layer 322 may move from the first display area DA1 to the second display area DA2 (e.g., move in the second direction D2). For example, when the display device 1100 is in the first state (e.g., the display device 1100 of FIGS. 11 and 13), the fourth support layer 322 may be positioned in the first display area DA1, and when the display device 1100 1100 is in the second state (e.g., the display device 1100 of FIGS. 12 and 14), the fourth support layer 322 may be positioned in the second display area DA2. Accordingly, the second support member 320 may support the display panel PNL in the first display area DA1 and the second display area DA2.

In an embodiment, when the fourth support layer 322 moves from the first display area DA1 to the second display area DA2, a portion of the fourth support layer 322 may be disposed in the first display area DAL. However, embodiments of the present disclosure are not necessarily limited thereto. For example, in an embodiment, when the fourth support layer 322 moves from the first display area DA1 to the second display area DA2, the fourth support layer 322 may not be disposed in the first display area DA1.

In a plan view, the third support layer 321 and the fourth support layer 322 may have shapes that interlock with each other. For example, when the fourth support layer 322 is positioned in the first display area DA1, the fourth support layer 322 may be interlocked with the third support layer 321. For example, when the fourth support layer 322 is positioned in the first display area DA1, the second support member 320 may have a square (e.g., rectangular) shape in a plan view.

For example, in an embodiment the third support layer 321 may include a first portion 321a having a length extending in the first direction D1 and a plurality of second portions 321b each having a length extending from the first portion 321a in the second direction D2 orthogonal to the first direction D1 and arranged to be spaced apart from each other in the first direction D1.

For example, in an embodiment the fourth support layer 322 may include a third portion 322a having a length extending in the first direction D1 and a plurality of fourth portions 322b each having a length extending from the third portion 322a in a direction opposite to the second direction D2 and arranged to be spaced from each other in the first direction D1.

Embodiments of the present disclosure can be applied to various electronic devices that may include a display device. For example, embodiments of the present disclosure can be applied to high-resolution smartphones, mobile phones, smart pads, smart watches, tablet PCs, in-vehicle navigation systems, televisions, computer monitors, notebook computers, and the like. However, embodiments of the present disclosure are not necessarily limited thereto and the electronic devices that the display device is applied to may vary.

The foregoing is illustrative of embodiments of the present disclosure and is not to be construed as limiting thereof. Although a few embodiments of the present disclosure have been described, those skilled in the art will readily appreciate that many modifications are possible in embodiments without materially departing from the present disclosure.

Accordingly, all such modifications are intended to be included within the scope of the present disclosure. Therefore, it is to be understood that the foregoing is illustrative of various, non-limiting embodiments of the present disclosure.

What is claimed is:

1. A display device comprising:
    a display panel including a first display area and a second display area adjacent to the first display area;
    a first support member disposed under the display panel and including a first support layer overlapping the first display area, and a second support layer overlapping the second display area, the second support layer having a thickness different from a thickness of the first support layer, wherein the first and second support layers each including a bottom surface that is positioned on a same plane as each other; and
    a second support member disposed under the first support member and movable from being disposed in the first display area to being disposed in the second display area or from being disposed in the second display area to being disposed in the first display area.

2. The display device of claim 1, wherein the thickness of the first support layer is greater than the thickness of the second support layer.

3. The display device of claim 1, wherein each of the first support member and the second support member includes a metal material.

4. The display device of claim 1, wherein the second support member includes an electromagnet.

5. The display device of claim 1, wherein when the second support member moves from being disposed in the first display area to being disposed in the second display area,
    a portion of the second support member overlaps the first display area.

6. The display device of claim 1, wherein the second support layer includes a plurality of stretchable portions having a lattice shape in a plan view.

7. The display device of claim 6, wherein each of the stretchable portions includes:
    a plurality of openings having a shape extending longitudinally in a first direction and arranged in the first direction and a second direction orthogonal to the first direction.

8. The display device of claim 1, wherein the second support member includes:
    a third support layer overlapping the first display area; and
    a fourth support layer movable from the first display area to the second display area or from the second display area to the first display area.

9. The display device of claim 8, wherein when the fourth support layer is positioned in the first display area,
    the second support member has a rectangular shape in a plan view.

10. The display device of claim 8, wherein the third support layer and the fourth support layer have shapes that interlock with each other in a plan view.

11. The display device of claim 8, wherein when the fourth support layer moves from the first display area to the second display area,
    a portion of the fourth support layer overlaps the first display area.

12. The display device of claim 1, wherein a distance between the bottom surfaces of the first and second support layers and a bottom surface of the display panel are equal to each other.

13. A display device comprising:
    a display panel including a first display area and a second display area adjacent to the first display area;
    a first support member disposed under the display panel and including a first support layer overlapping the first display area, and a second support layer overlapping the second display area, the second support layer having a thickness different from a thickness of the first support layer;
    a second support member disposed under the first support member and movable from the first display area to the second display area or from the second display area to the first display area; and
    an adhesive member including:
        a first adhesive layer disposed on the first display area between the display panel and the first support layer, and
        a second adhesive layer disposed on the second display area between the display panel and the second support layer.

14. The display device of claim 13, wherein a thickness of the first adhesive layer is less than a thickness of the second adhesive layer.

15. A display device comprising:
    a display panel including a first display area and a second display area adjacent to the first display area in a first direction;
    a first support member disposed under the display panel and including a first support layer and a second support layer, the first and second support layers each including a bottom surface that is positioned on a same plane as each other; and
    a second support member disposed under the first support member and movable in the first direction from being disposed in the first display area to being disposed in the second display area or from being disposed in the second display area to being disposed in the first display area,
    wherein the second support layer includes a plurality of stretchable portions having a lattice shape in a plan view.

16. The display device of claim 15, wherein the first support layer overlaps the first display area, and the second support layer overlaps the second display area.

17. The display device of claim 15, wherein a thickness of the first support layer is greater than a thickness of the second support layer.

18. The display device of claim 15, wherein when the second support member moves from being disposed in the first display area to being disposed in the second display area,
    a portion of the second support member overlaps the first display area.

19. The display device of claim 15, wherein each of the first support member and the second support member includes a metal material.

20. The display device of claim 15, wherein each of the stretchable portions includes:
    a plurality of openings having a shape extending longitudinally in a second direction orthogonal to the first direction and arranged in the first direction and the second direction.

* * * * *